(12) United States Patent
Ackermann et al.

(10) Patent No.: US 10,641,929 B2
(45) Date of Patent: May 5, 2020

(54) PLANAR OPTICAL MODULE FOR TRACKING AND COLLIMATING INCIDENT LIGHT

(71) Applicant: INSOLIGHT SA, Lausanne (CH)

(72) Inventors: Mathieu Ackermann, Lausanne (CH); Laurent Coulot, Lausanne (CH); Florian Gerlich, Lausanne (CH)

(73) Assignee: INSOLIGHT SA, Lausanne (CH)

( * ) Notice: Subject to any disclaimer, the term of this patent is extended or adjusted under 35 U.S.C. 154(b) by 0 days.

(21) Appl. No.: 15/768,832

(22) PCT Filed: Nov. 17, 2016

(86) PCT No.: PCT/IB2016/056921
§ 371 (c)(1),
(2) Date: Apr. 26, 2018

(87) PCT Pub. No.: WO2017/085657
PCT Pub. Date: May 26, 2017

(65) Prior Publication Data
US 2018/0306950 A1 Oct. 25, 2018

(30) Foreign Application Priority Data
Nov. 20, 2015 (CH) ...................................... 1694/15

(51) Int. Cl.
*G02B 27/10* (2006.01)
*G02B 3/00* (2006.01)
(Continued)

(52) U.S. Cl.
CPC ............ *G02B 3/0062* (2013.01); *F24S 23/31* (2018.05); *G02B 6/0011* (2013.01);
(Continued)

(58) Field of Classification Search
CPC .... G02B 3/0062; G02B 27/30; G02B 6/0011; H01L 31/0543; Y02E 10/40; Y02E 10/52
See application file for complete search history.

(56) References Cited

U.S. PATENT DOCUMENTS 5,415,727 A 5/1995 Gal et al.
2010/0278480 A1 11/2010 Vasylyev
(Continued)

FOREIGN PATENT DOCUMENTS

WO 20090063416 A2 5/2009

OTHER PUBLICATIONS

ISR for PCT/IB2016/085657.

*Primary Examiner* — Alicia M Harrington (57) ABSTRACT

Planar optical module (100, 100') for capturing, converging and collimating incident light (3, 3') with a variable incident direction comprising: —a first optical arrangement (10) with an optical layer able to converge the incident light-beam (3, 3'), forming thereby a converging light-beam (4, 4') and —a second optical arrangement (20) placed downstream said first optical arrangement (10), said second optical arrangement (20) having an optical layer collimating said converging light-beam(s) (4, 4'), forming thereby a collimated and concentrated beam (5, 5'), wherein the first and second optical arrangements (10, 20) are movable one relative to the other such that the relative position of first and second optical arrangements (10, 20) allows said collimated and concentrated beam (5, 5') to have an orientation which is, in a plane perpendicular to the main plane (P) of the planar optical module (100, 100'), predetermined, fixed and independent from the direction of the incident light (3, 3'). Preferentially, the first optical arrangement (10) comprises two optical layers (11, 12) movable one relative to the other, the second optical arrangement (20) comprises either an optical layer formed by one or a plurality of reflective (Continued)

elements (26, 27) having a concave surface or comprises only one optical layer with variable refractive-index elements (23) or with fluorescent dyes (25).

20 Claims, 8 Drawing Sheets

(51) Int. Cl.
    *G02B 27/30*     (2006.01)
    *H01L 31/054*     (2014.01)
    *F21V 8/00*     (2006.01)
    *F24S 23/30*     (2018.01)

(52) U.S. Cl.
    CPC ........... *G02B 6/0066* (2013.01); *G02B 27/30* (2013.01); *H01L 31/0543* (2014.12); *H01L 31/0547* (2014.12); *Y02E 10/40* (2013.01); *Y02E 10/52* (2013.01)

(56) References Cited

U.S. PATENT DOCUMENTS

| | | |
|---|---|---|
| 2011/0079267 A1 | 4/2011 | Raymond et al. |
| 2011/0226332 A1 | 9/2011 | Ford et al. |
| 2012/0216863 A1* | 8/2012 | Wen .................. G02B 5/06 136/259 |
| 2015/0063751 A1 | 3/2015 | Tremblay et al. |

\* cited by examiner

PLANAR OPTICAL MODULE FOR TRACKING AND COLLIMATING INCIDENT LIGHT

FIELD OF THE INVENTION

The present invention relates to solar energy and illumination systems, and more specifically to an optical module for capturing, converging and collimating incident light with a variable incident direction, an optical system comprising said optical module and also a method for capturing, converging and collimating incident light.

DESCRIPTION OF RELATED ART

Photovoltaic (PV) cells have been widely used to convert sunlight energy into electrical power, due to the rising demand of renewable energy linked to greenhouse gas emissions and fossil fuels reserves depletion. The dominant solar technology consists of individual mono- or polycrystalline silicon PV cells, assembled in flat panel modules and covering the entire area irradiated by sunlight. This technology is mature and proven in mass production, but its efficiency is in practice typically limited to 16-22% for single junction silicon solar cells. While higher efficiencies PV cells based on multi-junctions exist, their price is prohibitive, which limits their usage to the space industry. Solar PV efficiency is a key factor, as it directly impacts the price of the electrical power generated by the panel, as well as the area needed for the solar installation.

Figure 12A:
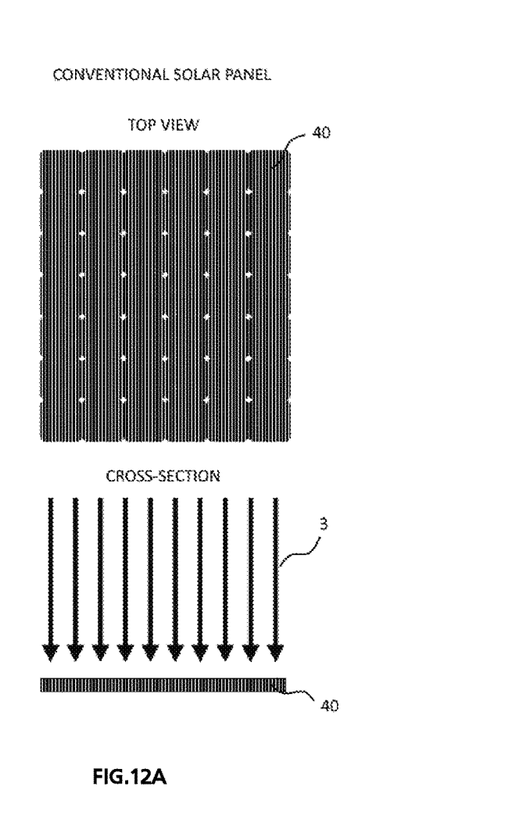
Figure 12B:
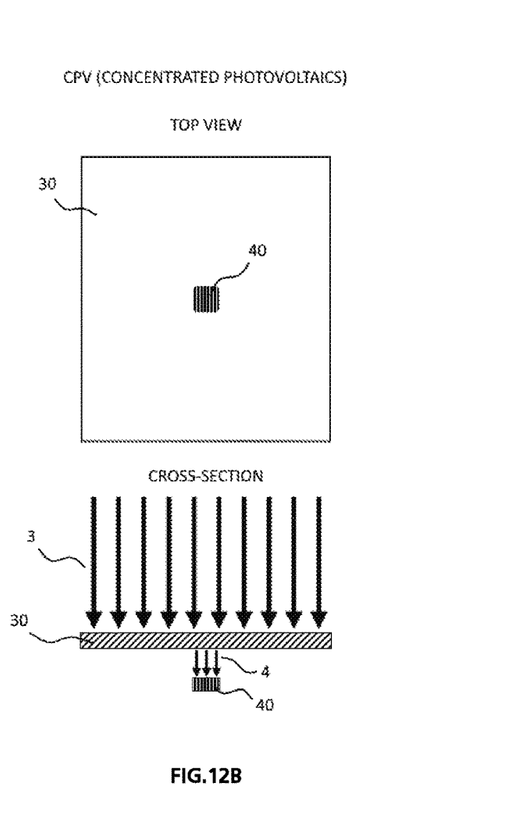

One solution to make the use of high efficiency PV cells affordable is Concentrated Photo Voltaics (CPV). These systems concentrate irradiating sunlight on a PV cell of smaller area, which reduces the bill of material for the PV cell, as shown between FIG. 12A and FIG. 12B. The best existing PV cells technologies (efficiencies >40%) become then affordable. Although the PV cell area is reduced, the system can generate equal or even greater electrical power under concentrated sunlight. These solar concentrators use optical components, such as lenses or mirrors, which offer potential for costs reductions. Consequently, it is possible to generate electricity at a smaller cost of production than with traditional silicon PV cells.

However, one of the technical challenges consists in tracking incident light, notably when incident light is solar light, as its angle of incidence varies over time. Indeed, one drawback of the CPV systems is that they need to be constantly oriented towards the light source, namely the sun, to effectively act as concentrator. This is because of the physical principle of étendue, which limits the maximum concentration factor for a given angular acceptance. While the sun is moving through the sky over days and seasons, it results in large variations of azimuthal and elevation angles. A conventional concentrator with a fixed orientation requires wide acceptance angles to cover these variations, and will therefore only achieve relatively small concentration factors (<10), according to the étendue principle.

Figure 13:
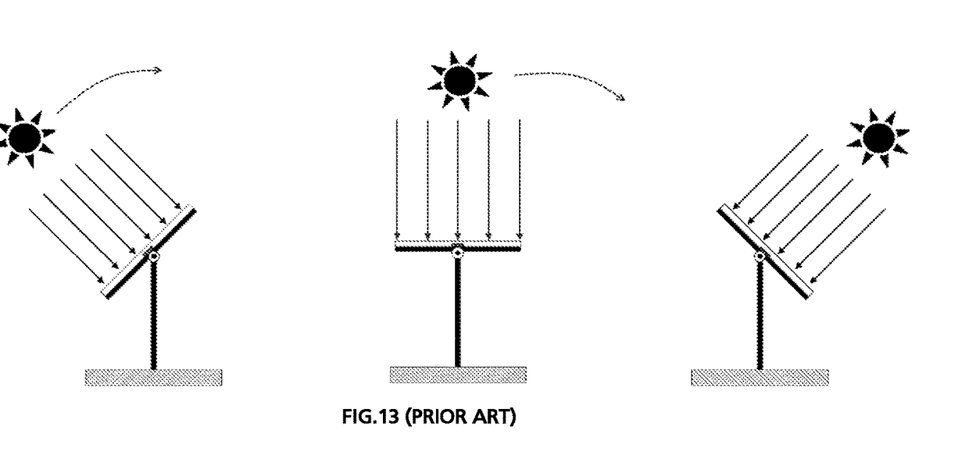

A common solution to overcome the étendue limitation with a CPV system consists in actively rotating the concentrator panel towards the sun, so that incident sunlight is always normal to the panel (see FIG. 13). The angular acceptance of the concentrator can then be relatively small (<2 deg), allowing for relatively large concentration factors (>100).

There are several drawbacks related to this active sun tracking by rotation of the concentrator panel. The panel has to rotate along two axis to follow azimuthal and elevation changes, with extremely high accuracy requirements on both angular positions (typically <0.5 degrees). Furthermore, the system has to move the total weight of the entire panel, resulting in significant power consumption, and reliability issues with wind load. Most of these tracking systems are space consuming and thus not suitable for residential installations. Overall, these drawbacks generate overheads in terms of cost and size, as well as energy wastes. Therefore, there is a need to simplify the tracking mechanism for CPV systems to overcome the limitations of current solutions, and become more competitive versus conventional solar panels.

Several optical modules allowing to track incident solar light without tilting the concentrator have been proposed. They are based either on planar optical elements or photoreactive materials.

US2011226332-describes a system and method to inject incoming light with various incident angles in a slab waveguide, employing micro-tracking. The system includes a plurality of lenses that converge light on a plurality of relatively small faceted mirrors or prisms in the waveguide. The reflection on those small reflective surfaces allows activating total internal reflection in the waveguide.

WO09063416 relates to a sunlight collector comprising a converging array of lenses, a wedge shape spacer, a waveguide, a collimator and a photovoltaic cell. In order to follow sun azimuthal and elevation changes, the array of lenses are continuously oriented to converge sunlight on the reflecting surfaces at the bottom of the light guide. Here as well, the corrected beam enters a waveguide component which guides said corrected beam laterally up to photovoltaic cells.

US2010278480 describes an optical module comprising a collector array and a waveguide, wherein the incident light from a light source (for instance a LED) is first guided along the planar direction of the waveguide, exits from the waveguide and thereafter is collimated by a collimator array.

US2015063751 describes a system to capture solar light with various incident angles, comprising at least one lens, a waveguide and a self-adapting coupling feature. The at least one lens adjacent to the waveguide converges long wavelength light components (near infrared, infrared) onto the self-adapting coupling features, which is configured to couple the short wavelength components (ultraviolet, visible, near infrared) in the waveguide, forming thereby a "self-tracking" solar concentrator.

U.S. Pat. No. 5,415,727 describes a system comprising a large aperture microlens array assembly having at least two arrays of microlenses with individual unit cell trains optically interconnecting individual microlenses in one array with related individual microlenses in another array. This system allows to have the incident light beam entering the first array of microlenses, to be transformed into a collimated outlet light beam at the outlet of the second array of microlenses, placed downstream to the first array of microlenses.

There also exist luminescent solar concentrators which are photonics systems that can achieve sunlight planar concentration with wide acceptance angle, while staying at a fixed orientation. It is formed by fluorescent dyes distributed in an optical waveguide; when a fluorescent dye is stroke by incident light, it re-emits light at a longer wavelength. The reradiated light is then partially trapped in the waveguide by total internal reflection and propagates along the planar direction.

Existing optical modules achieve planar solar concentration with only limited angular acceptance and/or efficiency, and therefore often need to be used in combination with an external tracking system. Furthermore, most of the existing micro-tracking systems require a specific waveguide design and therefore cannot be used with other types of concentrating optics. Luminescent concentrators, on the other hand, suffer from important losses as the rest of the emitted light escapes the waveguide. Also, further absorptions of light already trapped in the waveguide lead as well to important losses, reducing the efficiency of the system.

Therefore, there is a need for a simplified optical micro-tracking system for CPV applications, which overcomes the drawbacks of existing solutions. This optical module should allow to track and collect incident light with wide acceptance angles and to output concentrated and collimated light with a fixed, preferably pre-defined, orientation.

In order to form a complete CPV solution, the said optical micro-tracking system should be coupled to one or more concentrator(s) and solar cell(s) placed downstream the optical path. For this purpose, the output characteristics of the said optical micro-tracking system should be compatible with existing concentrating optics, including among others Fresnel lenses, parabolic mirrors, Cassegrain optics, Winston cones, planar waveguides or fluorescent solar concentrators.

In order to simplify the design of the concentrator placed downstream the optical path, the said optical micro-tracking system should output discrete concentrated light beams with smaller total area that the incident beam. Indeed, the spacing between collimated beams at the output reduces the risk of optical obstruction.

The present invention aims to provide an alternative solution to existing optical modules.

BRIEF SUMMARY OF THE INVENTION

According to the invention, these aims are achieved by means of a planar optical module for capturing, converging and collimating incident light with a variable incident direction comprising:

a first optical arrangement with at least one optical layer able to converge the beam of said incident light, forming thereby at least one converging light beam, and a second optical arrangement placed downstream the first optical arrangement, said second optical arrangement having at least one optical layer able to collimate said converging light beam(s), forming thereby at least one collimated and concentrated beam;

wherein the first and second optical arrangements are moveable one relative to the other such that the relative position of first and second optical arrangements allows said collimated and concentrated beam(s) to have an orientation which is, in at least in one plane perpendicular to the main plane of the planar optical module, predetermined, fixed and independent from the direction of the incident light.

The goal of the invention is to redirect incident light to output a light beam, or several discrete light beams, with a constant orientation, in at least in one plane perpendicular to the main plane of the planar optical module, independently of the angle variations of the incident light, while possibly keeping the position and tilt of the concentrator fixed.

Therefore, the present invention provides a solution with mobile optical elements, in which the light passing into the first optical arrangement and thereafter directly into the second optical arrangement results into an output light. In the present invention, the converged beam at the output of the first optical arrangement is thereafter directly collimated and redirected with a predetermined fixed orientation.

With such an optical module according to the invention, the incident light is globally reoriented, concentrated and also collimated to form an output light at the output of the first and second arrangements. This output light has the required properties for further treatment, notably conversion into electricity. Therefore, when the incident light is sunlight, which is a naturally collimated light, the optical module allows a reorientation of this light, to have an output light also collimated but with a predetermined fixed orientation, after reorientation of the beams by the optical module.

Preferably, this predetermined fixed orientation is orthogonal to the main direction of said second optical arrangement. Preferably, this predetermined fixed orientation is parallel to the optical axis of the optical module, namely orthogonal to the main plane formed by the optical module. This situation corresponds in most cases to a vertical optical axis of the optical module and therefore a vertical output light. Alternatively, this predetermined fixed orientation has another direction, non-parallel, with respect to the optical axis of the optical module.

Consequently, the invention relates to a planar optical module defining an optical axis that is orthogonal to the plane direction defined by the optical module (main plane), the incident light being received by the planar optical module with a direction parallel or tilted with respect to the optical axis. Independently from the direction of the incident light, the output light is always orientated with the same predetermined fixed orientation when projected in at least in one plane perpendicular to the main plane of the planar optical module. In some configurations of the invention, the planar optical module, the output light is always orientated with the same predetermined fixed orientation, for all the planes perpendicular to the main plane (P) of the planar optical module in which a projection is made.

The present invention provides an optical module with at least one converging layer (first optical arrangement) and a collimating layer (second optical arrangement), this optical module collecting incident light (for instance sunlight) while providing collimated light at the output, with both converging layer(s) and collimating layer(s) being movable relative to each other, in order to be able to track the incident light and notably sunlight (solar light). Also, since the output light is always orientated with the same predetermined fixed orientation, there is no need to adapt neither the orientation nor the position of the converging layer or any other optical element placed downstream the optical module according to the invention.

Also the present invention concerns an optical system for capturing, converging and collimating incident light, comprising the above described optical module, and an optical concentrator placed downstream of said optical module. When further associated to a downstream solar cell or group of solar cells, a planar CPV (Concentrator Photovoltaics) solution is provided. When further associated to some heat absorbers elements, a planar thermal solar panel is provided.

At the outlet of the optical module according to the invention, there is provided an output light which is collimated, concentrated and which also presents a pre-defined orientation: therefore it offers more flexibility to design the optical element placed downstream (such as an optical concentrator). Indeed, the spacing between the collimated beams reduces the risk of optical obstruction.

Where most of existing planar micro-tracking devices have been designed for a specific concentrator, strongly limiting the scope of potential applications, the micro-tracking system described in the present invention is compatible with various concentrator types. Furthermore, this micro-tracking system outputs a collimated light beam with a fixed orientation, which can then be directed towards the center of the concentrator, achieving higher concentration factors than most existing planar micro-tracking implementations, where light is directed towards the edges of the concentrator (usually a waveguide).

In addition, the present invention relates to a method for capturing, converging and collimating incident light, the method comprising:

receiving incident light at a first optical arrangement with at least one optical layer able to converge the beam of said incident light, forming thereby at least one converging light beam, receiving the converged beam at a second optical arrangement with at least one optical layer able to able to collimate said converged beam, forming thereby at least one collimated and concentrated beam; wherein said first and second optical arrangements form a planar optical module, and placing said first and second optical arrangements in a relative position to the other so that said collimated and concentrated beam forms an output having an orientation which is, in at least in one plane perpendicular to the main plane of the planar optical module, predetermined, fixed and independent from the direction of the incident light.

Preferably, said first and second optical arrangements are parallel to each other and to the main plane defined by the optical module. Particularly, all optical layers of said first optical arrangement and all optical layers of said second optical arrangement are parallel to each other.

Also, preferably, said predetermined fixed orientation of the collimated and concentrated beam is orthogonal to the main direction of said second optical arrangement. Also, preferably, said predetermined fixed orientation of the collimated converged beam is parallel to the optical axis of the optical module.

Said incident light source can be of any known type, including but not limited to incandescent lighting, heat emitting bodies, light emitting diodes (LEDs), lasers, sunlight, light/heat scattering, radiating surfaces, or any other devices or combinations thereof adapted for generating light. Particularly, said incident light is solar light.

The invention provides with a solution that can be used for light sources being non-monochromatic light sources, and more generally sources with a large wavelength range (for instance the sun). Preferably, the optical module according to the invention (or any optical system comprising such optical module) works with a light source that has a wavelength range from 300 nm to 1300 nm. This is a distinction from some prior art systems which are designed for monochromatic sources such as lasers.

Also, the invention provides with a solution which is preferably a non-imaging system, i.e an optical system (optical module alone or coupled to other element(s) such as an optical concentrator placed downstream of said optical module) which does not form an image of the input light (incident light source) at the output of the optical system (output light, concentrated and collimated beam(s) with a fixed orientation).

BRIEF DESCRIPTION OF THE DRAWINGS

The invention will be better understood with the aid of the description of embodiments given by way of example and illustrated by the figures, in which.

DETAILED DESCRIPTION OF POSSIBLE EMBODIMENTS OF THE INVENTION

As illustrated on FIGS. 1 to 8, the optical module 100 according to the invention is composed of a stack of optically structured layers having at least two optical arrangements placed one above the other. There is a first optical arrangement 10 comprising one optical layer or more, and particularly two optical layers, for converging the incident light, so as to form a converged beam. There is also, preferably placed directly downstream and parallel to said first optical arrangement 10, a second optical arrangement 20 comprising one optical layer or more, and particularly two optical layers, for collimating the converged light so as to form a converged collimated beam.

The optical module 100 is planar, which means the optical module extends mainly into two orthogonal directions, defining a main plane P for the optical module 100, with respect to a limited extension into a third direction, orthogonal to the main plane P and parallel to the optical axis A of the optical module 100. Therefore, the optical axis A of the optical module 100 is orthogonal to the main plane P (see FIG. 1A). Generally, the main plane P is horizontal and the third direction is vertical. Generally, the converged collimated beam is also vertical.

In the present text upstream (downstream) concerns a position along the optical light path that is before (after) another element. Also, in the present text a horizontal direction (vertical direction) concerns a direction of the light orthogonal (parallel with respect) to the optical axis A.

Also, in the present text, the different following terms are defined as follows:

an optical element is a individual lens or reflective element, an optical layer (or optical array) is an array of optical elements arranged in a plane (reference signs 11, 12), an optical arrangement is a group of one or more optical layers forming a part in one single piece (reference sign 10, 20, 10', 20'), an optical module is a group of two optical arrangements configured with a specific relative position for redirecting and concentrating incident light (reference sign 100, 100'), a group of optical modules is a group of one or two or more optical module(s) (reference sign 110), and An optical system comprises one optical module or a group of optical modules, a concentrator and solar cell(s) forming for instance a complete CPV system (reference sign 200).

When the incident light is sunlight, the optical module 100 is preferably placed with the main plane P being horizontal as shown in the illustrated embodiment. Nevertheless, the optical module 100 according to the invention can also be placed with the main plane P in other inclination with respect to a horizontal plane.

Figure 1A:
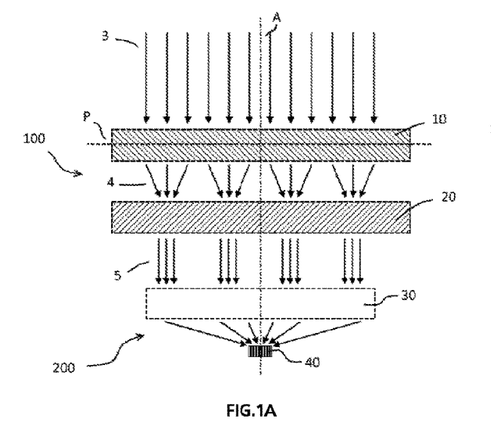
FIG. 1A illustrates, with a side view, the general concept of the invention for an incident light presenting a direction parallel to the optical axis of the planar optical module according to the invention.

According to the invention, the optical module 100, as visible from FIG. 1A, which illustrates the general concept without details on the optical structure of the optical module 100, the optical module 100 is composed of a stack of two optically structured arrangements 10, 20. More generally, the optical module 100 comprises therefore at least two stacked optical arrangements 10 and 20, these arrangements having a planar configuration and forming layers or multiple layer arrangements.

In order to track, converge and re-orient incident light/sunlight, the optical layers are able to move (horizontally, vertically, or in both directions) with reference to each other. The input is a beam 3 or 3' of collimated light/sunlight with an arbitrary angle α with respect to the optical axis A (α being 0° in FIG. 1A and a being different from 0° in FIG. 1B). Generally the angle α is less than 55°, and comprised in the range −35° to +35° with respect to the optical axis A. The output is a concentrated and collimated beam 5 or 5' of light with a fixed orientation, whatever the angle α of the incident light/sunlight. In the figures the output beam 5 or 5' is shown as a vertical beam, but the same optical module could be developed to output a horizontal or almost horizontal beam or a beam with any other arbitrary inclination with respect to a vertical plane.

Figure 1B:
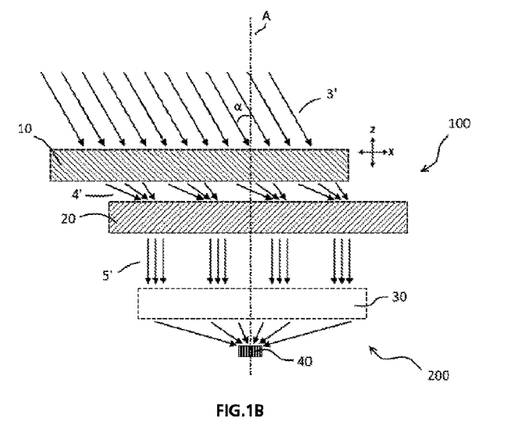
FIG. 1B is a view similar to FIG. 1A for an incident light presenting an inclined direction with respect to the optical axis of the planar optical module according to the invention.

In FIG. 1A and FIG. 1B, the first optical arrangement 10 redirects the light towards the second optical arrangement 20, forming at its outlet one or a plurality of converging beam(s) 4 or 4'.

FIG. 1A shows the situation for an incident light 3 with an angle α equals to 0° with respect to the optical axis A of the optical module 100. In this situation, the relative position of the first optical arrangement 10 with respect to the second optical arrangement 20 is determined by the position of the focal point(s) of the converging beam(s) 4 coming from the first optical arrangement 10. As the incident light has an incident angle α equal to 0°, the paraxial equation is valid and the optical axis of each optical structures of the arrangement 10 and 20 are respectively aligned. Therefore, the first optical arrangement 10 is optically coupled with respect to the second optical arrangement 20, so as to have an output light, namely one or a plurality of converged and collimated beam(s) 5 which has a predetermined fixed orientation (here vertical and parallel to the optical axis A).

Preferably, as shown in FIGS. 1A and 1B, at the output of said optical module 100, are formed several collimated and concentrated beams 5 which are separated light beams with higher irradiance (higher concentration factor) than the incident light beam 3. More precisely, as can be seen in FIGS. 1A and 1B, the beams 5, 5' are discrete beams, separated from each other, each beams 5 or 5' being more concentrated than the incident light beam 3. In other words, the beams 5, 5' are singular/separated beams. This means that the output of said optical module 100 is not a single continuous beam In FIG. 1A and FIG. 1B, at the outlet of the second optical arrangement 20 the concentrated and collimated beams 5, 5' are very similar or identical beams, being both parallel to the optical axis A of the optical module 100, and having a reduced beam waist. This restricted lateral extent of the output beam 5, 5' allows reducing the risk of optical obstruction for the optical components disposed downstream the optical module 100. Notably, these optical components, such as a concentrator, can be chosen and designed with more flexibility since they do not need to extend laterally in large proportion.

In other words, this means that the total lateral extent of the output beam 5, 5' (sum of the lateral extent of the discrete output beams 5, 5') is smaller than the lateral extent of the incident light beam entering the optical module 100. For instance, the lateral extent of the output beam 5, 5' (sum of the lateral extent of the discrete output beams 5, 5') is equal or smaller than 90% (preferably 60%, preferably 50%, preferably 30%, and more preferably 10%) of the lateral extent of the incident light beam entering the optical module 100.

FIG. 1B shows the situation for an incident light 3' with an angle α different from 0° with respect to the optical axis A of the optical module 10. In this situation, the relative position of the first optical arrangement 10 with respect to the second optical arrangement 20 has changed in order to take into account the inclined direction of the incident light 3'. In this case, the second optical arrangement 20 has not moved whereas the first optical arrangement 10 has moved both downwards (Z or vertical direction) and in the left direction (X or first horizontal direction). Between FIG. 1A and FIG. 1B the displacement XZ of the first optical arrangement 10 has been implemented in order to adapt the planar optical module 10 to the angle α of the incident sunlight.

This new relative position of the first optical arrangement 10 with respect to the second optical arrangement 20 is determined by the field curvature of the converging beam(s) 4' coming from the first optical arrangement 10. Indeed, as the incident light 3' is tilted with an angle α different from 0°, those rays cannot be considered in the paraxial approximation of each optical structure, and the focal point(s) of each converging beam(s) 4' will move on the XZ plane along a curve close to the Petzval field curvature. The second optical arrangement 20 needs therefore to follow a similar displacement to compensate for this field curvature.

Also, the light concentration factor of the optical module 100, which is proportional to the beam waist of the converging beams 4,4' when it intersects the second optical arrangement 20, is higher or equal to 1.

In a first embodiment, as shown in FIGS. 2 and 4 to 7, different variants are given for redirecting incident light tilted in the XZ plane with optical arrangements 10 and comprising both only one optical layer. In some variants, the said first optical arrangement 10 comprises only one optical layer formed by an array of lenses with at least one convex surface. For each convex lens of the optical array, the most convex face of this optical layer is turned upstream, namely towards the entrance side of the first optical arrangement 10, which is the top face in the Figures. These convex lenses are preferably circular lenses or cylindrical lenses. They can be double convex, convex-concave or plano-convex lenses, with any curvature.

Figure 2A:
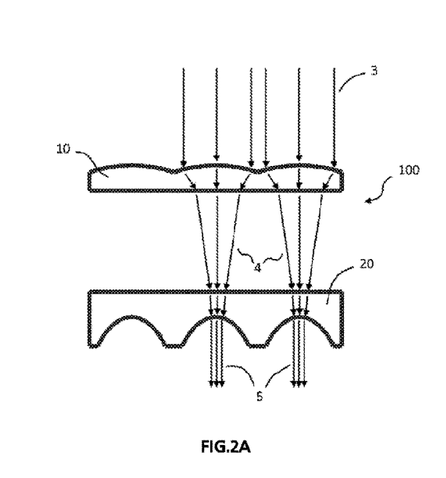
FIGS. 2A and 2B are views respectively similar to FIGS. 1A and 1B for a first variant of a first embodiment of the planar optical module according to the invention.
Figure 2B:
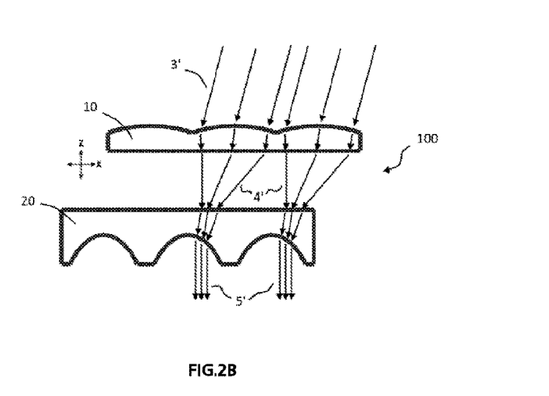

In a first variant of said first embodiment, as shown in FIGS. 2A and 2B, the said second optical arrangement 20 comprises only one optical layer formed by lenses with at least one concave surface, with the most concave face of this optical layer turned downstream, namely towards the outlet side of the first optical arrangement 10, which is the bottom face in the Figures. These concave lenses are preferably circular concave lenses or cylindrical concave lenses. They can be double concave, convex-concave or plano-concave lenses, with any curvature.

As can be seen from FIG. 2B, according to a possible configuration, said first optical arrangement 10 and second optical arrangement 20 are moveable one relative to the other in a first direction (for instance X) of said plane parallel to said main plane P of the planar optical module 100 and in a second direction (direction Z) orthogonal to said main plane P of the planar optical module 100. In another configuration, not shown, said first optical arrangement 10 and second optical arrangement 20 are moveable one relative to the other only in a plane (for instance directions X and Y) parallel to said main plane (P) of the planar optical module 100. In another configuration, not shown, said first optical arrangement 10 and second optical arrangement 20 are moveable one relative to the other only in one single direction (for instance X) of said plane parallel to said main plane P of the planar optical module 100.

Figure 4:
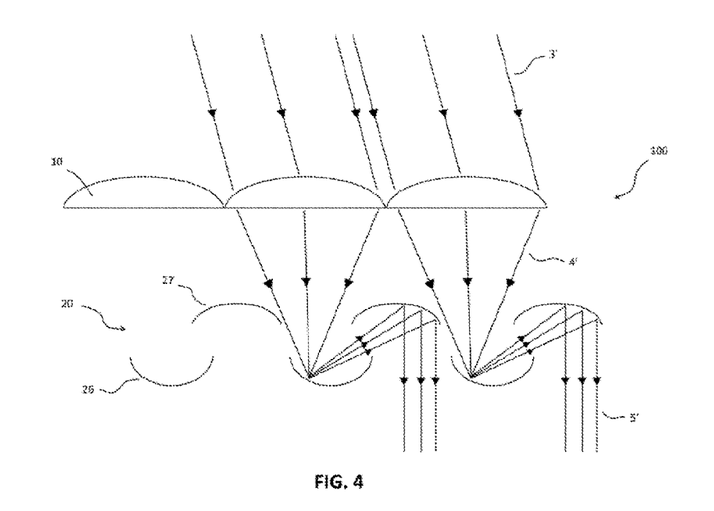
FIG. 4 is a view respectively similar FIG. 1B for a second variant of the planar optical module according to the first embodiment of the invention, comprising reflective mirrors in the second optical arrangement.

In a second variant of said first embodiment, as shown in FIG. 4, said second optical arrangement 20 comprises one optical layer formed by one or a plurality of reflective elements 26, 27 with a least one concave surface: this array of reflective elements 26, 27 form the said second optical arrangement 20. Preferably, these reflective elements 26, 27 are reflective mirrors alternatively orientated upwards and downwards. The first array of reflective mirrors 26 redirects the converging beam(s) 4' coming from the first optical arrangement 10, which are then reflected again and collimated by the second array of mirror(s) 27, forming collimated vertical beam(s) 5'. Preferably, the size of each mirror elements should be smaller than the size of the lens element in the first optical arrangement 10, in order to avoid shading. The mirrors can be reflective surface from any type, spherical or aspherical.

Figure 5:
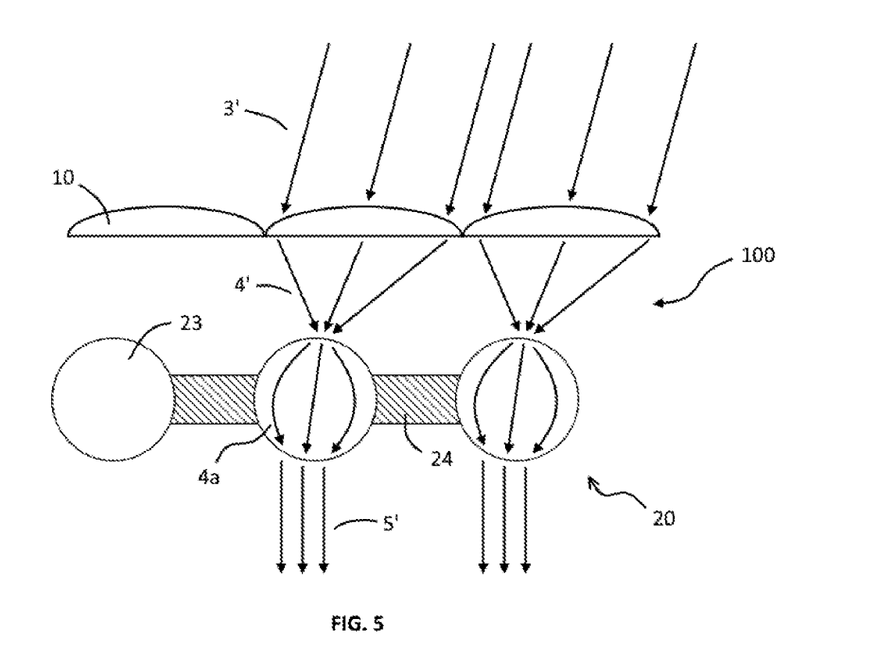
FIG. 5 is a view respectively similar FIG. 1B for a third variant of the planar optical module according to the first embodiment of the invention, comprising lenses with variable refractive index in the second optical arrangement.

In a third variant of the first embodiment as shown in FIG. 5, the said second optical arrangement 20 comprises only one optical layer with variable refractive index optical elements 23. In FIG. 5, the optical layer of said second optical arrangement 20 is formed by an array of Luneburg lenses 23 connected to each other in a planar configuration with joints 24: In that variant, the focal point(s) of the converging beam(s) 4' are aligned on the focal point(s) of the Luneburg lenses 23. As the Luneburg lenses 23 have numerical aperture unity, they can collimate all the converging beams from various incident angles into a concentrated and reorientated beam 4a, which goes out from the Luneburg lenses 23 forming concentrated and collimated beam(s) 5'.

Figure 6:
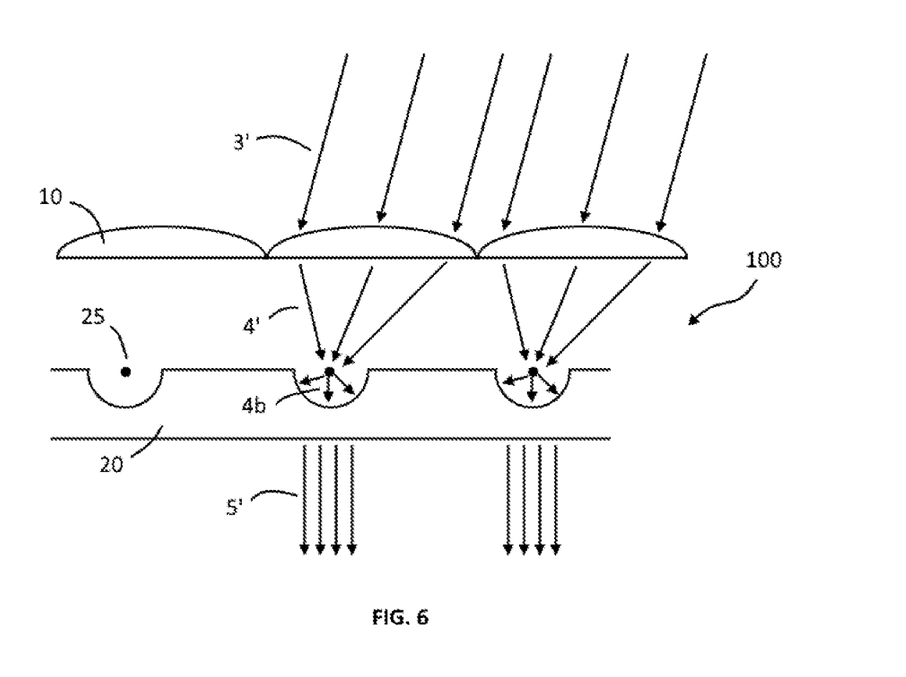
FIG. 6 is a view respectively similar FIG. 1B for a fourth variant of the planar optical module according to the first embodiment of the invention, comprising fluorescent dyes in the second optical arrangement.

In a fourth variant of the first embodiment as shown in FIG. 6, the said second optical arrangement 20 comprises only one optical layer with multiple embedded fluorescent dyes 25. In FIG. 6, the optical layer of said second optical arrangement 20 comprises an array of multiple fluorescent dyes 25 which absorb the incoming converging beam 4' coming from the first optical arrangement 10, and re-emit, eventually in an anisotropic manner, a plurality of diverging beams 4b. The emitting dyes can be seen as an array of small punctual light sources, which can therefore be collimated by an array of concave lenses in the second optical arrangement 20, forming thereby concentrated and collimated beam(s) 5' at the outlet of the second optical arrangement 20.

Figure 7A:
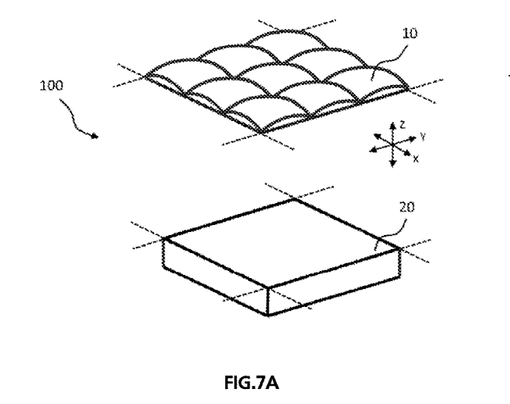
FIGS. 7A and 7B are two different perspective views of the first and second optical arrangements of the first variant of the optical module according to the first embodiment.
Figure 7B:
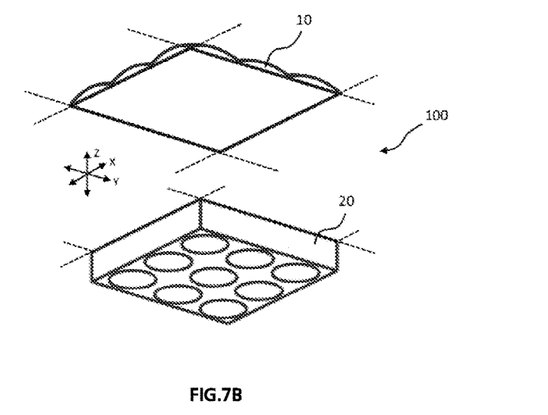

In a possible implementation of the first variant of the first embodiment as shown in FIGS. 7A and 7B, the first optical arrangement 10 and the second optical arrangement 20 are formed by an array of singular lenses, which are for instance, as shown, circular lenses. The dashed lines suggest the extension of the arrays in a plane parallel to the main plane P. In this variant the unique optical layer of the first optical arrangement 10 is formed by an array of circular convex lenses, and the unique optical layer of the second optical arrangement 20 is formed by an array of circular concave lenses (With said convex side of the lenses of said first optical arrangement being turned upwards, so that the light beam path enters said first optical arrangement from this convex side, and the concave side of the lenses of said second optical arrangement being either turned upwards or downwards). Each lens outline can be from any shape including circular, this outline shape being preferably square or hexagonal to fill totally the irradiated area when forming an array of concave lenses. With such a square or hexagonal outline shape, the singular optical elements can be assembled together in an abutting manner: with such a configuration, the array of singular optical elements can fill completely the irradiated area.

Figure 3A:
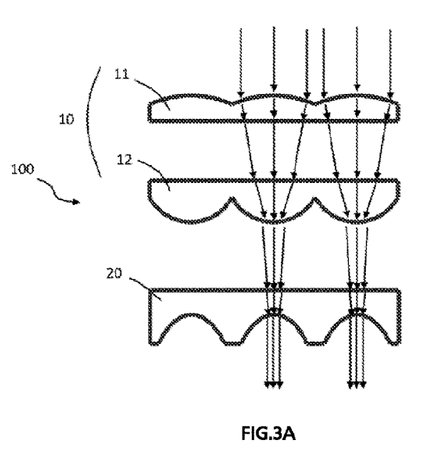
FIGS. 3A and 3B are views respectively similar to FIGS. 1A and 1B for a first variant of a second embodiment of the planar optical module according to the invention, with two optical layers in the first optical arrangement.
Figure 3B:
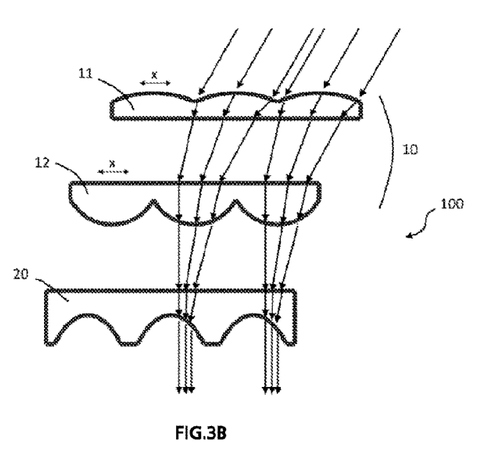
Figure 8A:
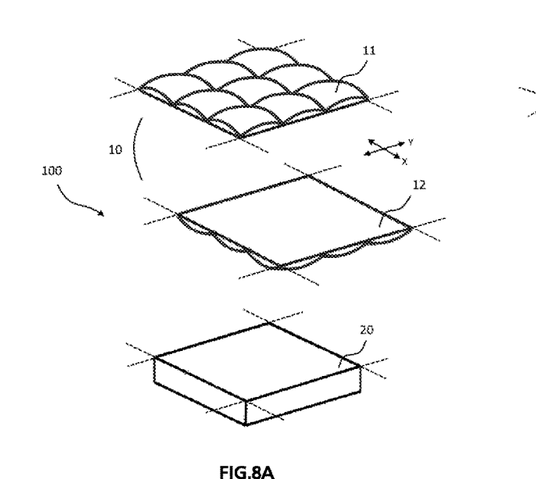
FIGS. 8A and 8B are two different perspective views of the first and second optical arrangements of the optical module according to the first variant of the second embodiment.
Figure 8B:
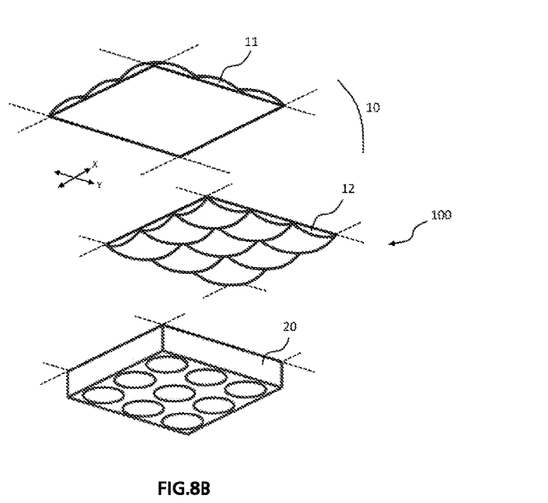

In some possible other configurations of the optical module 100 according to the invention, forming a second embodiment shown in FIGS. 3A and 3B, and in FIGS. 8A and 8B, the said first optical arrangement 10 comprises two optical layers 11, 12.

In a first variant of the second embodiment shown in FIGS. 3A and 3B, preferably, said first optical arrangement comprises a first optical layer 11 formed by an array of plano-convex lenses with the curved face turned upstream and a second optical layer 12 which is formed by an array of plano-convex lenses with the curved face turned downstream.

In this first variant of the second embodiment shown in FIGS. 3A and 3B, said second optical arrangement 20 comprises only one optical layer formed by an array of concave lenses, which are preferably circular concave lenses or cylindrical concave lenses or plano-concave lenses. Also each optical layer 11, 12 of the first optical arrangement 10 is horizontally moveable one relative to the other and is also horizontally moveable one relative to the optical layer of the second optical arrangement 20.

In a possible implementation of the first variant of the second embodiment, as shown in FIGS. 8A and 8B, the first optical arrangement 10 comprises two layers 11 and 12 formed by singular lenses, which are for instance, as shown, are circular lenses (circular outline). Therefore, in this variant, an array of circular convex lenses form the two optical layers 11 and 12 of the first optical arrangement 10, and an array of circular concave lenses form the unique optical layer of the second optical arrangement 20. The dashed lines suggest the extension of the arrays in a plane parallel to the main plane P. In this variant the two optical layers 11, 12 of the first optical arrangement 10 are formed by an array of circular convex lenses, and the unique optical layer of the second optical arrangement 20 is formed by an array of circular concave lenses (with said convex sides of said lenses of said first layer 11 of the first optical arrangement 10 being turned upwards, so that the light beam path enters said first optical arrangement 10 from this convex side, and the convex side of the lenses of said second layer 12 of the first optical arrangement 10 being either turned upwards or downwards, and the concave side of said lenses of said second optical arrangement 20 being also turned either downwards or upwards). Each lens outline can be from any shape including circular, this outline shape being preferably square or hexagonal to fill totally the irradiated area when forming an array of concave lenses. With such a square or hexagonal outline shape, the singular optical elements can be assembled together in an abutting manner: with such a configuration, the array of singular optical elements can fill completely the irradiated area.

According to other variants (not shown) of the second embodiment, the only layer of the second optical arrangement 20 can also be made with singular optical elements which are not concave lenses but reflective elements 26,27 or variable refractive index optical elements 23 or multiple embedded fluorescent dyes 25, respectively as described above with respect to the second to fourth variants of the first embodiment.

In other variants, not shown, of the first and second embodiments, instead of the singular lenses shown in FIG. 7A-7B and FIG. 8A-8B, the optical layer(s) of said first optical arrangement 10 and the optical layer(s) of said second optical arrangement (20) comprise an array of cylindrical optical elements with an axis of the cylinder which is parallel to the main plane (P). Preferably, said cylindrical optical elements are parallel to each other and to a first direction contained in the main plane (P). The convexity or concavity nature and orientation of these cylindrical optical elements are conform to the previously described arrangement for FIG. 7A-7B and FIG. 8A-8B.

As described above, some specific shapes (convex surface, concave surface, double convex, double concave, convex-concave, plano-convex lenses or plano-concave lenses . . . ) are preferably used for the optical elements forming the optical layer, namely for the lenses. More generally, preferably at least one of the lens surfaces of these lenses is (are) aspherical (based on a high order polynomial), with one or more inflexion points. In other words, the same lens surface can be made locally concave and convex in different areas, to offer different curvatures to the incident light depending on its incidence angle and path. This provides more flexibility in the design of the first and second optical arrangements 10, 20, in order to fulfil the optical requirements. Among these optical requirements, there is the angular requirement, namely the tough angular acceptance requirement for successively collecting and re-orienting incident light with a large angular acceptance. Preferably, this angular acceptance, namely the range of angular incidence of the input light that can be accepted by the optical module according to the invention, is from 0° (orthogonal to the main plane of the optical module or parallel to the optical axis A) up to at least +/−50° (forming an angle of −50° or +50° with respect to the vertical direction which is parallel to the optical axis A). Such an angular acceptance requirement is derived from the need of providing a solution that can be used for a solar panel with fixed orientation, while covering a wide range of angles along two axes to cope with the relative sun displacement during the hours of the day (period of time with sunlight during each day) which change along the year.

Also, in all embodiments, as shown in FIG. 2A, said converged collimated light 5 or 5' forms preferably separated light beams.

In an embodiment, the optical layers of the optical module 100 are made of a transparent or semi-transparent material such as optical glass, polymethylmethacrylate (PMMA), polycarbonate, PDMS, silicone or optical resins.

As shown in FIGS. 1A and 1B, an optical system 200 is formed with any of the previously described optical module 100 (or group 110 of optical modules), a concentrator 30 placed downstream said optical module 100 (or group 110 of optical modules), and a solar cell 40 placed at the focal point downstream said concentrator 30.

Figure 9A:
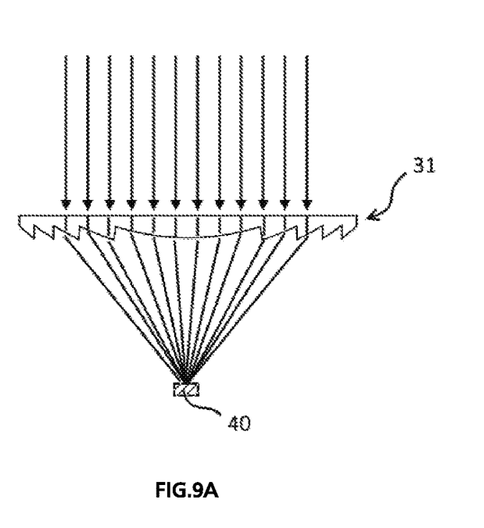
FIG. 9A to 9D show possible optical elements that can be used as optical concentrator system placed downstream of said optical module in order to form an optical arrangement for capturing, converging and concentrating converged incident light, FIG. 10A relates to a diagram showing the relative displacements required between the first optical arrangement and the second optical arrangement for incident angles of 25 degrees and 40 degrees respectively, for the first variant of the first embodiment of the planar optical module according to the invention, FIG. 10B relates to a diagram showing the relative displacements required between the two layers of the first optical arrangement and the second optical arrangement for an incident angle of 25 degrees, for the first variant of the second embodiment of the planar optical module according to the invention.
Figure 9B:
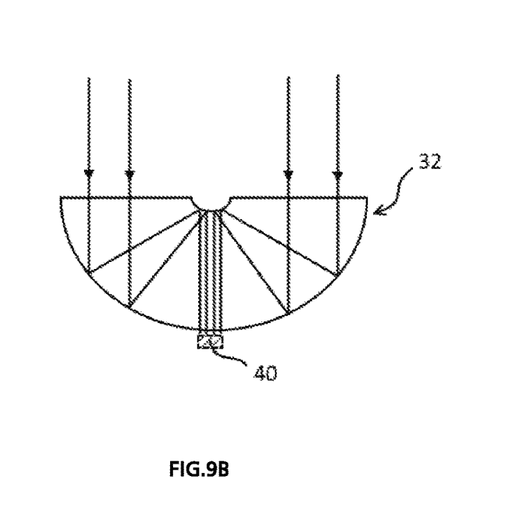
Figure 9C:
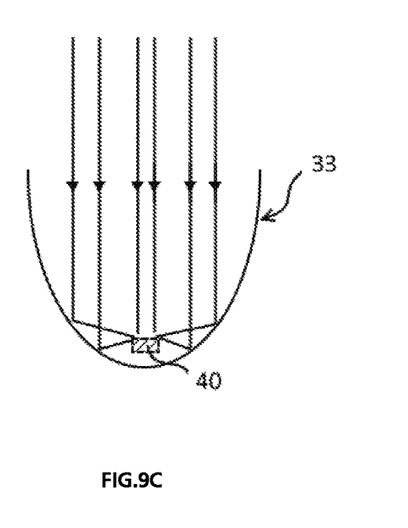
Figure 9D:
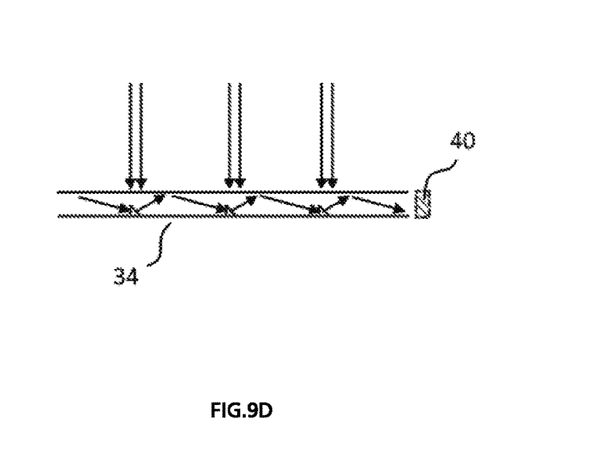

Such a concentrator 30 can be formed by different concentrating optics as shown in FIG. 9A to 9D. Since the beam at the output of the optical module 100 is concentrated and collimated with a fixed orientation, it can easily be converged on a solar cell 40 (or a plurality of them) by existing optical concentrators 30, including among others Fresnel lenses, parabolic mirrors, Winston cones or light-guides. As the required acceptance angle of the concentrator is small, the concentration factor can potentially be very high (200 and more). In FIG. 9A, the concentrator 31 is a Fresnel lens. In FIG. 9B, the concentrator 32 is a Cassegrain optical element. In FIG. 9C, the concentrator 33 is a parabolic mirror. In 9D, the concentrator 34 is a waveguide working as a light-guide injecting system up to the solar cell 40, which in that specific configuration is placed at the lateral side of the concentrator 34.

Figure 10A:
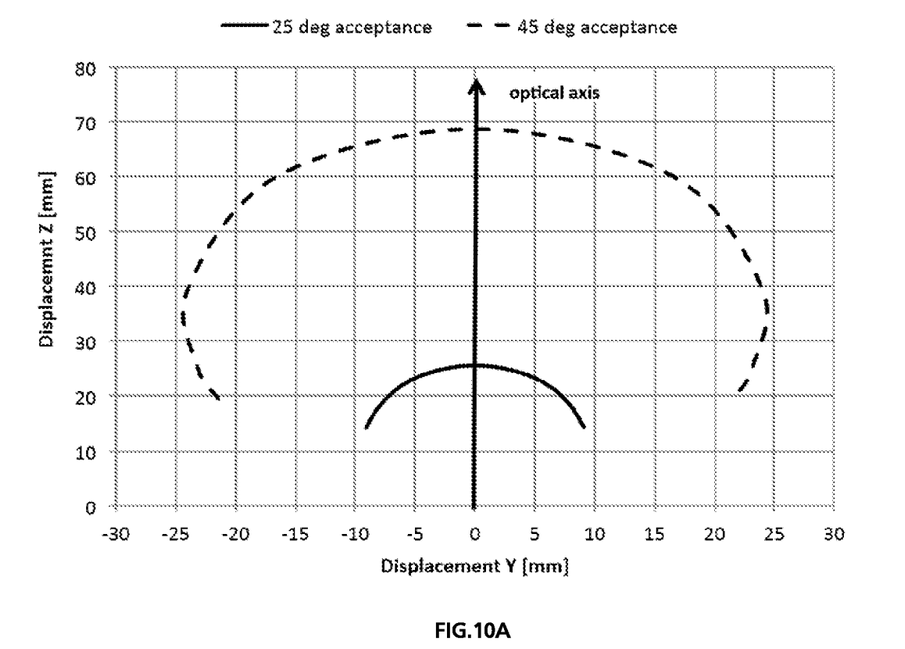

FIG. 10A shows the displacements in the vertical or Z direction and in the horizontal or X direction of the first optical arrangement 10 with respect to the second optical arrangement 20, for two optical modules designed for different angular acceptances (25° and 45°). The displacement curve is shown for an incident angle ▫ ranging from 0 to respectively 25° or 45° with respect to the optical axis A. The maximum displacement being of 70 millimeters, it remains within a range that can be easily implemented.

Figure 10B:
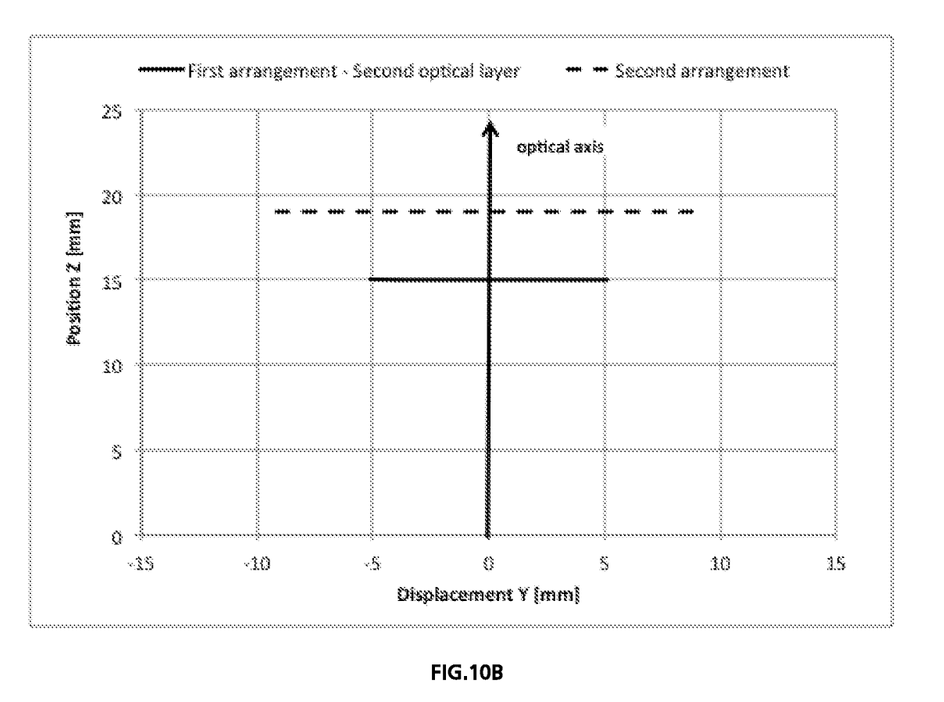

FIG. 10B shows the displacements in the vertical or Z direction and in the horizontal or X direction of the first optical layer 11 and the second optical layer 12 of the first optical arrangement 10 with respect to the second optical arrangement 20, in reference to FIG. 3. The displacements curves are given for an incident angle α ranging from 0 to 25° with respect to the optical axis A. There is no vertical displacement or along Z direction in this configuration.

Figure 11:
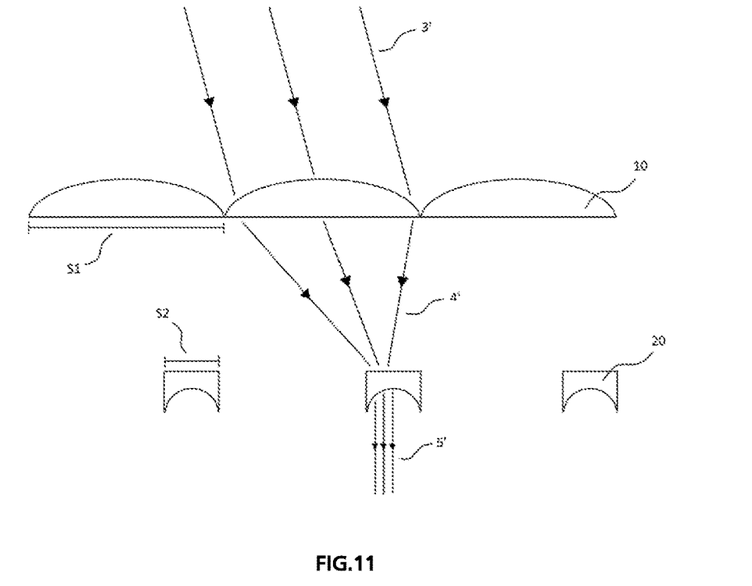
FIG. 11 is a side view of a fifth variant of the first embodiment according to the present invention, where the size of the optical elements forming the second optical arrangement is considerably smaller than the ones forming the first optical arrangement, FIG. 12A and FIG. 12B, which have already been described, are schematics showing respectively standard photovoltaics panels and concentrated photovoltaics panels (CPV), and FIG. 13, which has already been described, relates to conventional tracking used in CPV application, according to prior art.

FIG. 11 shows a variant of the first embodiment of the optical module described in this invention, where the size S2 of the optical elements of the arrays in the second arrangement 20 is considerably smaller than the size S1 of the optical elements of the arrays in the first arrangement 10. This implies that the second optical arrangement is placed closer to the focal point of the converging beam(s) 4', which allows reducing the waist of the collimated beam(s) 5' at the output, achieving higher concentration. In all the embodiments described in the present invention, the size of the optical elements in the different optical arrangements can be considerably different. In the present text, the term size means the average dimension in the plane containing the outline of the optical element and parallel to the main plane (P) of the planar optical module 100 (100'), namely the mean lateral dimension of the basement and not the height (or the depth). Preferably, the optical elements of said second optical arrangement 20 have a size S2 which is 50% up to 90% smaller than the size S1 of the optical elements of said first optical arrangement 10

Means for implementing the displacement of the first optical arrangement 10 with respect to the second optical arrangement 20 include among others mechanical and/or electromechanical and/or magnetomechanical systems. An electrical motor can be used in conjunction with some guiding mechanisms. As an example, a stepper or servomotor (actuator) can be used with an eccentric cam translating the displacement. Some reduction gears, belts or cables can be added to obtain several thousand steps per rotation of the axis of the electrical motor and therefore a high resolution (in the micron's range). Linear motor, pneumatic, electrostatic or magnetic actuators are possible variants for the actuation. Springs, leaf springs or scissors linkages are possible guiding mechanisms, among others.

Preferably, according to the present invention, the possible displacements of the first optical arrangement 10 with respect to the second optical arrangement 20 are only translational movement, but no rotational movement is involved. This also applies for the movement of the first optical layer 11 and the second optical layer 12 of the first optical arrangement 10 with respect to the second optical arrangement 20, as previously described. Such translations are possible along one axis (X, Y or Z), two axes (X and Y, X and Z or Y and Z) or three axes (X, Y and Z) depending on the arrangement of the optical system. Such situation, namely the absence of rotation in the movements implemented in the optical system, allow for a simple arrangement/design notably for the actuation and guiding system which control the movements of the mobile parts of the optical system. Moreover, that situation minimizes the overall volume in which the system moves.

In the present text, the expression "planar optical module" means that the largest geometrical dimension of the optical parts of this optical module and the largest geometrical dimension of this optical module extend in a parallel direction to the main plane of the planar optical module. This means that the optical module (system) is relatively planar and flat. Practically, such a provision is advantageous when the optical module of the invention is part of a solar panel placed on a roof, or of a lamp placed on the ceiling, since such a not too thick panel/lamp is less bulky. As a consequence, the optical elements used, notably the lenses, should also have a planar configuration. Since the lens diameter is related to the size of the light collection or light emitting elements, the lens thickness is preferably smaller, or equal or almost equal to the lens diameter (or other geometrical dimension orthogonal to the direction of light). This means that the aspect ratio between lens thickness and lens diameter is preferably close to 1:1 or 1. More generally, preferably the aspect ratio between lens thickness and lens diameter is preferably comprised between 1.2 and 0.3, more preferably between 1.1 and 0.6, and more preferably between 1.05 and 0.8.

The present invention also concerns a planar optical module for capturing, converging and collimating incident light with a variable incident direction comprising:

a first optical arrangement with at least one optical layer able to converge the beam of said incident light, forming thereby at least one converging light beam, and a second optical arrangement placed downstream the first optical arrangement, said second optical arrangement having at least one optical layer able to collimate the said converging light beam(s), forming thereby at least one collimated and concentrated beam;

wherein the first and second optical arrangement are moveable one relative to the other such that the relative position of first and second optical arrangements allows said collimated and concentrated beam(s) to form an output with a predetermined and fixed orientation, which is independent from the direction of the incident light. Such a situation occurs notably with the different variants of the first embodiment or of the second embodiment shown in FIGS. 2A-2B, 3A-3B, 4 to 6, 7A-7B and 8A-8B.

REFERENCE SIGNS USED IN FIGURES

A Optical axis
P Main plane
X First horizontal direction
Y Second horizontal direction
Z Vertical direction
S1 Size of the optical element in the first optical arrangement
S2 Size of the optical element in the second optical arrangement
3 Incident light with 0° angle with respect to the optical axis
3' Incident light with angle different from 0° with respect to the optical axis
4 Converged beam
4' Converged beam
4a Converged and reorientated beam
4b Converged and reorientated beam
5 Converged and collimated beam
5' Converged and collimated beam
10 First optical arrangement (for converging incident light)
10' First optical arrangement (for converging incident light)
11 First optical layer of the first optical arrangement
12 Second optical layer of the first optical arrangement
20 Second optical arrangement
20' Second optical arrangement
23 Spherical Luneburg sphere
24 Joint between Luneburg spheres
25 Fluorescent dyes
26 Reflective element (mirror)
27 Reflective element (mirror)
30 Concentrator
31 Fresnel lens
32 Cassegrain optic
33 Parabolic mirror
34 Light-guide injection element
40 Solar cell
100 First optical module
100' Second optical module
110 Group of optical modules
200 Optical system

The invention claimed is:

1. A planar optical module having a main plane (P), for capturing, converging and collimating an incident light with a variable incident direction, comprising:
    a first optical arrangement comprising at least one optical layer constructed and arranged to converge the incident light, forming thereby at least one converging light beam, and
    a second optical arrangement placed downstream the first optical arrangement along a direction perpendicular to the main plane (P), said second optical arrangement having at least one optical layer constructed and arranged to collimate said at least one converging light beam from the first optical arrangement, forming thereby at least one collimated and concentrated output beam;
    wherein the first and second optical arrangements are moveable one relative to the other such that the relative position of first and second optical arrangements allows said at least one collimated and concentrated output beam to have an orientation which is, in at least in one plane perpendicular to the main plane (P) of the planar optical module, predetermined, fixed and independent from the direction of the incident light;
    wherein said at least one collimated and concentrated output beam comprises a plurality of discrete collimated and concentrated output beams each having an irradiance higher than the incident light;
    where a collective lateral extent of the plurality of discrete collimated and concentrated output beams is less than a lateral extent of the incident light.

2. The optical module according to claim 1, wherein the first and second optical arrangements are substantially parallel to the main plane (P) and parallel to each other.

3. The optical module according to claim 2, wherein said predetermined fixed orientation of the collimated and concentrated output beam is orthogonal to said main plane (P) of the planar optical module.

4. The optical module according to claim 1, wherein said first optical arrangement comprises only one optical layer formed by lenses with at least one convex surface.

5. The optical module according to claim 1, wherein said first optical arrangement comprises two optical layers moveable one relative to the other.

6. The optical module according to claim 5, wherein each optical layer of the first optical arrangement is horizontally moveable one relative to the other and is also horizontally moveable one relative to the second optical arrangement.

7. The optical module according to claim 5, wherein said first optical arrangement comprises a first optical layer formed by plano-convex lenses with the convex face turned upstream, and a second optical layer which is formed by plano-convex lenses with the convex face turned downstream.

8. The optical module according to claim 7, wherein the aspect ratio between lens thickness and lens diameter is preferably comprised between 1.2 and 0.3.

9. The optical module according to claim 1, wherein said second optical arrangement comprises only one optical layer formed by lenses with at least one concave surface.

10. The optical module (100, 100') according to claim 1, wherein said first optical arrangement comprises only one optical layer formed by lenses with at least one convex surface, wherein said second optical arrangement comprises only one optical layer formed by lenses with at least one concave surface, and wherein said first optical arrangement and second optical arrangement are moveable one relative to the other only in a plane parallel to said main plane (P) of the planar optical module.

11. The optical module according to claim 1, wherein said second optical arrangement comprises at least one optical layer formed by one or a plurality of reflective elements with a least one concave surface.

12. The optical module according to claim 1, wherein said second optical arrangement comprises only one optical layer with variable refractive index optical elements or with fluorescent dyes.

13. The optical module according to claim 1, wherein the optical layer(s) of said first optical arrangement and the optical layer(s) of second optical arrangement comprise(s) an array of singular optical elements.

14. The optical module according to claim 13, wherein said singular optical elements have a square or a hexagonal outline shape.

15. The optical module according to claim 13, where the size of the optical elements of said second optical arrangement is smaller than the size of the optical elements of said first optical arrangement.

16. The optical module according to claim 1, wherein the optical layer(s) of said first optical arrangement and the optical layer(s) of said second optical arrangement comprise an array of cylindrical optical elements with an axis of the cylinder which is parallel to the main plane.

17. An optical system for capturing, converging and collimating an incident light, comprising:
    at least one planar optical module, the at least one planar optical module having a main plane (P) and comprising:
    a first optical arrangement with at least one optical layer able to converge said incident light and form at least one converging light beam, and
    a second optical arrangement placed downstream from the first optical arrangement along a direction substantially perpendicular to the main plane (P), said second optical arrangement having at least one optical layer constructed and arranged to collimate said at least one converging light beam to obtain a corresponding at least one collimated and concentrated output light beam,
    wherein the first and second optical arrangements are moveable relative to one another in manner such that a given relative position of the first and second optical arrangements allows said at least one collimated and concentrated output light beam to have an orientation which is, in a plane perpendicular to the main plane (P) of the planar optical module, predetermined, fixed, and independent from the direction of the incident light;
    wherein said at least one collimated and concentrated output light beam comprises a plurality of separated collimated and concentrated output light beams with a higher irradiance than the incident light;
    wherein a total lateral extent of the plurality of collimated and concentrated output light beams is smaller than a total lateral extent of the incident light entering the first optical arrangement; and
    an optical concentrator placed downstream of said at least one planar optical module.

18. A planar optical module having a main plane (P) for capturing, converging and collimating an incident light having a variable incident direction, comprising:
    a first optical arrangement comprising a single optical layer formed by an array of lenses with at least one convex surface and being constructed and arranged to converge said incident light, thereby forming at least one converging light beam; and a second optical arrangement placed downstream of the first optical arrangement, said second optical arrangement having at least one optical layer comprising an array of singular optical elements and being constructed and arranged to collimate said at least one converging light beam, forming thereby at least one collimated and concentrated output light beam;

wherein the first and second optical arrangements are parallel to each other and substantially parallel to the main plane (P), and are moveable one relative to the other such that the relative position of first and second optical arrangements allows said at least one collimated and concentrated output light beam to have an orientation which is orthogonal to said main plane (P) of the planar optical module, wherein the size of the optical elements of said second optical arrangement is smaller than the size of the optical elements of said first optical arrangement.

19. A planar optical module according to claim 18, wherein said first optical arrangement comprises a single optical layer formed by an array of biconvex lenses having an hexagonal outline shape.

20. A planar optical module for capturing, converging and collimating incident light beam with a variable incident direction comprising:

a first optical arrangement with at least one optical layer able to converge said incident light beam, forming thereby at least one converging light beam, and a second optical arrangement placed downstream the first optical arrangement, said second optical arrangement having at least one optical layer able to collimate said converging light beam(s), forming thereby at least one output light beam, said output light beam being a collimated and concentrated beam;

wherein said first and second optical arrangements define a main plane (P) for the planar optical module, wherein the first and second optical arrangements are moveable one relative to the other such that the relative position of first and second optical arrangements allows said output light beam(s) to have an orientation which is, in at least in one plane perpendicular to the main plane (P) of the planar optical module, predetermined, fixed and independent from the direction of the incident light beam, wherein said second optical arrangement comprises either:

only one optical layer formed by lenses with at least one concave surface; or at least one optical layer formed by at least one reflective element with at least one concave surface.

* * * * *